US006534399B1

(12) United States Patent
 Krivokapic

(10) Patent No.: US 6,534,399 B1
(45) Date of Patent: Mar. 18, 2003

(54) DUAL DAMASCENE PROCESS USING SELF-ASSEMBLED MONOLAYER

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 172 days.

(21) Appl. No.: 09/769,197

(22) Filed: Jan. 24, 2001

(51) Int. Cl.[7] .......................................... H01L 21/4763
(52) U.S. Cl. ....................... 438/638; 438/637; 438/622; 438/624; 438/666; 438/671; 438/672
(58) Field of Search ................................ 438/618, 622, 438/623, 624, 629, 637, 638, 652, 666, 667, 669, 671, 672, 720; 257/759, 760

(56) References Cited

U.S. PATENT DOCUMENTS

| | | | |
|---|---|---|---|
| 5,079,600 A | | 1/1992 | Schnur et al. .................. 357/4 |
| 5,512,131 A | * | 4/1996 | Kumar et al. ................ 438/738 |
| 5,514,501 A | * | 5/1996 | Tarlov ............................ 430/5 |
| 5,725,788 A | * | 3/1998 | Maracas et al. .................. 216/41 |
| 5,727,977 A | | 3/1998 | Maracas et al. ................ 445/24 |
| 5,751,018 A | * | 5/1998 | Alivisatos et al. ............. 257/64 |
| 5,885,753 A | * | 3/1999 | Crooks et al. ................ 430/325 |
| 5,922,214 A | * | 7/1999 | Liu et al. ........................ 216/2 |
| 6,048,623 A | * | 4/2000 | Everhart et al. ............. 428/464 |
| 6,087,231 A | | 7/2000 | Xiang et al. ................. 438/287 |
| 6,174,775 B1 | | 1/2001 | Liaw ............................ 438/283 |
| 6,184,126 B1 | * | 2/2001 | Lee et al. ..................... 438/637 |
| 6,187,657 B1 | | 2/2001 | Xiang ......................... 438/596 |
| 6,225,658 B1 | | 5/2001 | Watanabe ................... 257/296 |
| 6,238,982 B1 | | 5/2001 | Krivokapic et al. ......... 438/275 |
| 6,262,456 B1 | | 7/2001 | Yu et al. ...................... 257/371 |
| 6,365,466 B1 | * | 4/2002 | Krivokapic ................. 438/283 |
| 6,380,101 B1 | * | 4/2002 | Breen et al. ................. 438/765 |
| 6,413,587 B1 | * | 7/2002 | Hawker et al. ............. 427/264 |

OTHER PUBLICATIONS

Fabrication of Gold Nanostructures by Lithography with Self–Assembled Monolayers, vol. 39, No. 12, Dec. 1996, IBM Technical Disclosure Bulletin, pp. 235–238.*
Joanna Aizenberg, Andrew J. Black and George M. Whitesides, Controlling local disorder in self–assembled monolayers by patterning the topography of their metallic supports, Nature, Aug. 27, 1998, pp. 868–871.
Self–Assembled Monolayers, printed from Internet address: http://www.ifm.liu.se/applphys/molfil. . .ject/monolayer-structure/sam/sams.html on Oct. 9, 2000, 5 pages.
Self–assembled mono–multilayers, printed from Internet address: http://www.inapg.inra.fr/ens_rech/siab/asteq/elba/salayers.htm on Nov. 14, 2000, 3 pages.
Thin Semiconductor Layers Prepared from Langmuir–Blodgett Precursor, printed from Internet address: http://www.foresight.org/Conferences/MNT6/Papers/Erokhin/ on Nov. 14, 2000, 9 pages.
Monolayer Basics, printed from Internet address: http://www.langmuir–blodgett.com/basics/faq1.htm on Nov. 14, 2000, 6 pages.

(List continued on next page.)

Primary Examiner—Amir Zarabian
Assistant Examiner—Maria Guerrero
(74) Attorney, Agent, or Firm—Foley & Lardner

(57) ABSTRACT

A method of fabricating a trench on an integrated circuit having first and second insulative layers includes providing a layer of material over the insulative layers, forming a first self-assembled monolayer on the metal layers, etching the first self-assembled monolayer to form a first aperature in the layer of material, etching the first and second insulative layers through the first aperature to form a first portion of the trench, forming a second self-assembled monolayer on the layer of material, etching the second self-assembled monolayer to form a second aperature in the layer of material wider than the first aperature, and etching the second insulative layer through the second aperature to form a second portion of the trench.

21 Claims, 4 Drawing Sheets

OTHER PUBLICATIONS

Monolayer History, printed from Internet address: http://www.langmuir–blodgett.com/basics/faq2.htm on Nov. 14, 2000, 3 pages.

Langmuir Blodgett Assembly, printed from Internet address: http://mmpwww.ph.qmw.ac.uk/lbassem.html on Nov. 14, 2000, 2 pages.

U.S. Publication No. US 2001/000629 A1, filed May 3, 2001, by Tsukamoto, entitled "Semiconductor Device and Process of Producing the Same".

Lu et al., Ultrathin resist films patterning using a synchrotron radiation lithography system, Sep. 7, 1996, pp. 103–105.

Huang et al., Photopatterning of Self–Assembled Alkanethiolate Monolayers on Gold: A Simple Monolayer Photoresist Utilizing Aqueous Chemistry, Jan. 7, 1994, pp. 626–628.

Aoki et al., Molecular Patterning using Two–Dimensional Polymer Langmuir–Blodgett Films, Advanced Materials 1997, 9, No. 4, pp. 361–364.

Oh et al., Fabrication and Photodegradation Behavior of Photosensitive Polyimide LB Film, Mol. Cryst. and Liq. Cryst. 2001, vol. 370, pp. 169–172.

Iwamoto et al., Fine Patterns of Positive–Working Resists Using a Polyimide Langmuir–Blodgett Film System, Japanese Journal of Applied Physics, vol. 30, No. 2A, Feb., 1991, pp. L218–L221.

* cited by examiner

DUAL DAMASCENE PROCESS USING SELF-ASSEMBLED MONOLAYER

CROSS-REFERENCE TO RELATED APPLICATIONS

Not Applicable.

STATEMENT REGARDING FEDERALLY SPONSORED RESEARCH OR DEVELOPMENT

Not Applicable.

FIELD OF THE INVENTION

The present specification relates generally to a process of forming a trench for an integrated circuit and, more particularly, to a dual damascene process of forming a trench for an integrated circuit (IC). Even more particularly, the present specification relates to a dual damascene process that uses a self-assembled monolayer.

BACKGROUND OF THE INVENTION

The increased demand for higher performance integrated circuit (IC) devices has required the density of metallization lines to be increased and, in addition, has required the use of stacked layers to be increased. These requirements have necessitated the development of novel approaches in the methods of forming interconnections that not only integrate fine geometry definition but are also conducive to subsequent CMP (chemical mechanical polishing) processing. CMP is necessary to ensure that a subject layer is flat and planar enough to serve as a bottom layer for an additional layer.

As interconnection line widths shrink, the challenges of etching materials using photoresist-as-mask techniques have become increasingly difficult. A major cause of the difficulty is the large aspect ratios involved. The aspect ratio is the ratio of the depth of a feature being etched to the width of the feature (D/W) (or height-to-width in cross-section).

One method of forming a trench is a method known as a damascene process, which comprises forming a trench by masking and etching techniques and subsequent filling of the trench with the desired conductive material. The damascene process is a useful method for attaining the fine geometry metallization required for advanced semiconductor devices. A dual damascene process is a two-step sequential mask/etch process to form a two-level structure, such as a via, connected to a metal line above the via.

Conventional dual damascene processing technology entails depositing a triple layer sandwich consisting of a thick layer of an insulative material, an etch stop material having a high etch selectivity to the insulative layer, and a second thick layer of an insulative material. The two level structure is formed by masking and etching through the top layer of insulative material stopping on the layer of etch stop material, etching the etch stop material only, then performing a second masking and etching process in the top layer of insulative material only. The second mask and etch provides a larger trough than the first mask and etch with the second masking being an oversize masking.

The demand for increased density has required an increase in the aspect ratio of the photolithographic processes. However, the current dual damascene process has several problems that prevent the further increase of the aspect ratio. The lithography systems being used to expose the photoresist in the resist-as-mask process are limited by the wavelength of light used, the compositions of the photoresist, and the lithographic techniques employed.

Accordingly, an improved method of fabricating a trench on an integrated circuit is needed. Further, a method of fabricating a trench on an integrated circuit having a smaller width than available with conventional dual damascene processes is needed. Further still, what is needed is a method of fabricating a trench on an integrated circuit having a width which is controllable to dimensions not possible using conventional dual damascene processes. Further yet, what is needed is a method of forming interconnect lines for an IC using less critical masks than in conventional dual damascene processes. The teachings hereinbelow extend to those embodiments which fall within the scope of the appended claims, regardless of whether they accomplish one or more of the above-mentioned needs.

SUMMARY OF THE INVENTION

According to an exemplary embodiment, a method of fabricating a trench on an integrated circuit having first and second insulative layers includes: providing a layer of material over the insulative layers; forming a first self-assembled monolayer on the metal layer; etching the first self-assembled monolayer to form a first aperature in the layer of material; etching the first and second insulative layers through the first aperature to form a first portion of the trench; forming a second self-assembled monolayer on the layer of material; etching the second self-assembled monolayer to form a second aperature in the layer of material wider that the first aperature; and etching the second insulative layer through the second aperature to form a second portion of the trench.

According to another exemplary embodiment, a method of fabricating a trench and integrated circuit includes: providing an insulative material; providing a layer of material over the insulative material; providing etched selectivity to a portion of the layer by exposing the layer to a thiol; etching the portion having the etched selectivity to form a first aperature in the layer; etching the insulative material through the first aperature to form a first portion of the trench; and forming a second aperature wider than the first aperature and a second portion of the trench wider than the first portion of the trench.

According to yet another exemplary embodiment, an integrated circuit on a semiconductor substrate has first and second insulative layers. The insulative layers have different etched selectivities. Integrated circuit has a trench fabricated by the following process: providing a metal layer over the insulative layer; forming a first self-assembled monolayer on the metal layer; etching the first self-assembled monolayer to form a first aperature in the monolayer; etching the first and second insulative layers through the first aperature to form a first portion of a trench; forming a second self-assembled monolayer on the metal layer; etching the second self-assembled monolayer to form a second aperature in the metal layer wider than the first aperature; and etching the second insulative layer through the second aperature to form a second portion of a trench.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF THE INVENTION

Figure 1:
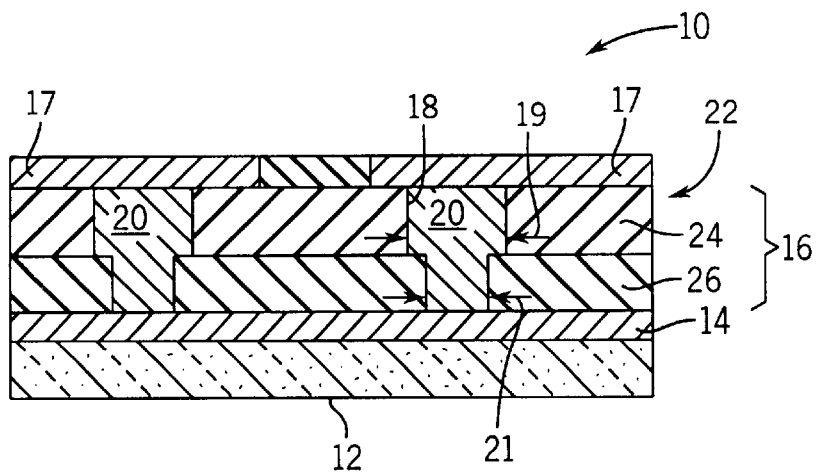
FIG. 1 is a schematic cross-sectional view of a portion of an integrated circuit, according to an exemplary embodiment.
Figure 2:
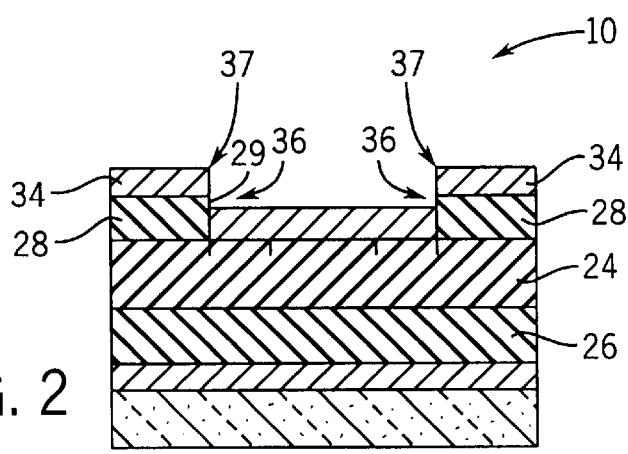
FIG. 2 is a schematic cross-sectional view of the integrated circuit of FIG. 1 illustrating metal patterning steps, according to an exemplary embodiment.

Referring to FIG. 1, a portion 10 of an integrated circuit includes a substrate 12 (e.g., a semiconductor substrate), other fabricated layers 14 (e.g., transistors, capacitors, interconnects, contacts, or other devices) and an interconnect layer 16. Interconnect layer 16 selectively provides electrical isolation and electrical conductivity between fabricated layers 14 and additional layers above layer 14, such as, a metal lines 17. Interconnect layer 16 includes a trench or via 18 filled with a conductive material 20, such as, a metal, tungsten, copper, etc. Trench 18 is located within an insulative layer 22 (e.g., a dielectric layer, such as, $SiO_2$, HSQ, porous oxide, etc.).

Insulative layer 22 can be a composite layer including a first insulative layer 24 and a second insulative layer 26 in this exemplary embodiment. Additional layers of devices (e.g., transistors, etc.) may be provided above conductive material 20 and insulative layer 22, wherein conductive material 20 provides electrical connection between said additional layers and fabricated layers 14.

Portion 10 is fabricated using a dual damascene process in this exemplary embodiment, though alternative processes may be used. Conductive material 20 has a depth of between 5,000 and 15,000 Angstroms (Å), and a width 19 at first insulative layer 24 of approximately 1,200 Å, or less than 2,000 Å. At second insulative layer 26, conductive material 20 has a width 21 of approximately 800 Å, or less than 1,500 Å. Advantageously, the width of conductive material 20 at first and second insulative layers 24 and 26 is smaller than that available using conventional dual damascene processes. For example, a conventional dual damascene process typically may achieve a width 21 of 2,500 Å at first insulative layer 24 and a width of 4,500 Å at second insulative layer 26. While the exemplary embodiment is illustrated with reference to interconnects or vias, the principles disclosed herein may alternatively be utilized for other trenches and other portions of an integrated circuit, or in other devices on an integrated circuit.

Referring now to FIGS. 2–9, a method of fabricating a trench on an integrated circuit will now be described. Using conventional dual damascene techniques, or other techniques, first and second insulative layers 24 and 26 are provided over fabricated layer 14 and/or substrate 12. Insulative layers 24 and 26 are provided by chemical vapor deposition (CVD) or other deposition processes, and each has a thickness of between 5,000 Å and 10,000 Å. In this exemplary embodiment, first and second insulative layers 24 and 26 have different etch selectivities sufficient that an etch step may etch one of layers 24 and 26 without substantially affecting the other of layers 24 and 26. Preferably, an etch selectivity of at least 2:1 is present between layers 24 and 26.

Next, a layer of material 28, such as a metal layer, is patterned (e.g., in a mask-and-etch process) over insulative layers 24 and 26. Since two vias will be fabricated from aperature 29, and one metal line will contact each via, layer 28 is patterned to form an aperture 29 having a width of twice the desired width of a via plus the minimum spacing between adjacent metal lines contacting the vias. For example, using 35 nanometers (nm) technology, aperture 29 is at least 250 nm.

Layer 28 includes a substance suitable for bonding to a molecule (e.g., a thiol) of a self-assembled monolayer. Suitable substances include gold, silver, silicon dioxide, gallium, arsenide, etc. In this exemplary embodiment, a metal layer is utilized. Metal layer 28 will act as an anchor for a self-assembled monolayer applied in a subsequent step. Metal layer 28 is deposited with a thickness of between 40 and 60 nm.

A second layer of material 34 is deposited over metal layer 28, by evaporation. Metal layer 28 can also be etched. Layer 34, like layer 28, is any material suitable for anchoring molecules used to form self-assembled monolayer. If a mask-and etch process is used, the photoresist is removed (e.g., by etching) or lifted off (e.g., by evaporation). Second metal layer 34 and metal layer 28 form sharp edges 36 having a high height profile at their intersections. In alternative embodiments, sharp edges 36 may have greater or lesser height profiles, depending upon the application. In this exemplary embodiment, a height profile of approximately 90 degrees is utilized. Layer 34 also has sharp edges 37, which may be etched, having a similar height profile as sharp edges 36.

Figure 3:
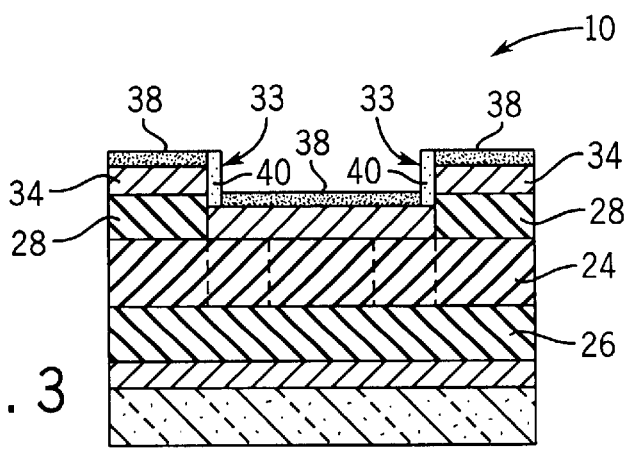
FIG. 3 is a schematic cross-sectional view of the integrated circuit of FIG. 1 illustrating a self-assembled monolayer forming step, according to an exemplary embodiment.

Referring now to FIG. 3, portion 10 is exposed to a thiol 33 or other molecule in a self-assembled monolayer fabrication step. The self-assembled monolayer in this exemplary embodiment is a layer of molecules, each molecule having an alkane chain, typically with 10 to 20 methylene units. Each molecule has a head group with a strong preferential adsorption to the substrate used, in this case, layers 28 and 34. One suitable head group is a thiol (S—H) group which works well with a gold or silver substrate. The thiol molecules adsorb readily from a solution onto the gold, creating a dense monolayer with the tail group pointing outwards from the surface, typically at an angle. By using thiol molecules with different tail groups, the resulting chemical surface functionality can be varied.

Figure 4:
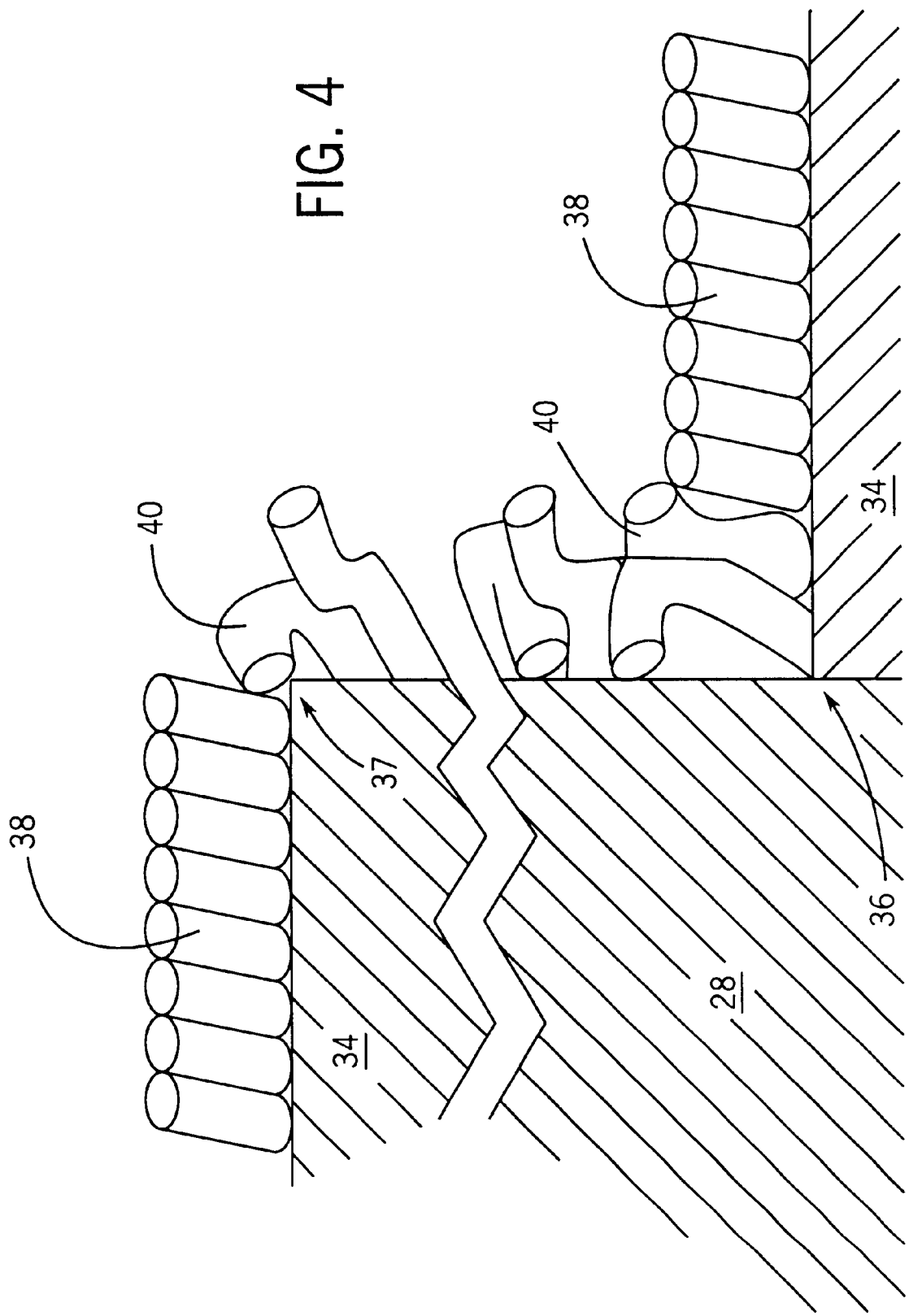
FIG. 4 is a schematic representation of a self-assembled monolayer on the integrated circuit of FIG. 1, according to an exemplary embodiment.

With reference to FIG. 4, sharp edges 36 and 37 of layers 28 and 34 are illustrated after being exposed to thiol. According to one example, a 10 mM solution of $HS(CH_2)_{15}X$ ($X=CH_3$ or $CO_2H$) is provided to layers 28 and 34 in an ethanol solution for approximately one hour. A plurality of ordered alkanethiolates 38 are formed on layers 28 and 34. At sharp edges 36 and 37, disorder occurs in the SAM, as illustrated by disordered alkanethiolates 40. Thus, by controlling the locations of disorder in alkanethiolates 38 by providing sharp edges 36 and/or 37, or other suitable topography, selectivity to a specific etching process can be obtained.

Figure 5:
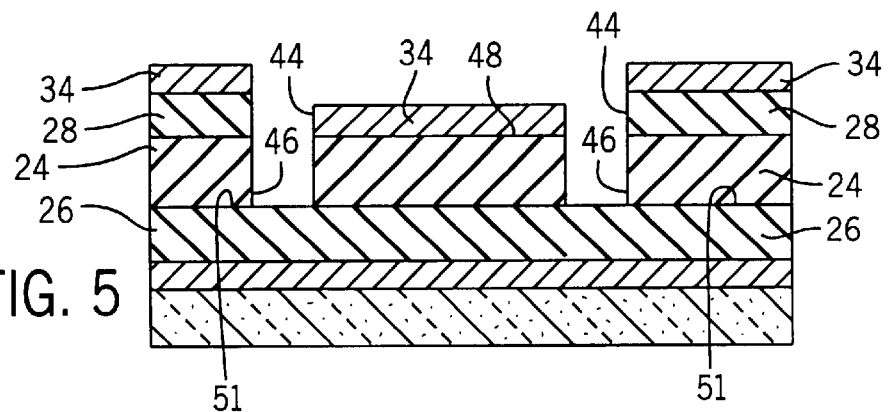
FIG. 5 is a schematic cross-sectional view of the integrated circuit of FIG. 1 illustrating an insulative layer etch step, according to an exemplary embodiment.

Referring to FIG. 5, a subsequent etching step selective to disordered alkanethiolates 40 etches a trough 44 in metal layer 28. The width of trough 44 is controllable by varying the etching time. In one example, etch time may be approximately 10 seconds, or between 5 and 15 seconds. Reference is made to J. Aizenberg et al., "Controlling local disorder in self-assembled monolayers by patterning the typography of their metallic supports", Nature, vol. 394, Aug. 27, 1998, pp. 868–871 for further alternatives.

Metal layers 28 and 34 are then used as a hard mask for subsequent insulative layer etching. A first etch process has a high selectivity to insulative layer 24, and not to metal layers 28 and 34 or insulative layer 26, such that, insulative layer 24 is etched but metal layers 28 and 34 and insulative layer 26 is not etched. A trench 46 is etched in insulative layer 24 extending from an upper surface 48 of dielectric layer 24 to an upper surface 51 of insulative layer 26. The width of trench 46 is preferably between 30 and 50 nm and the depth is preferably 200–500 nm.

Figure 8:
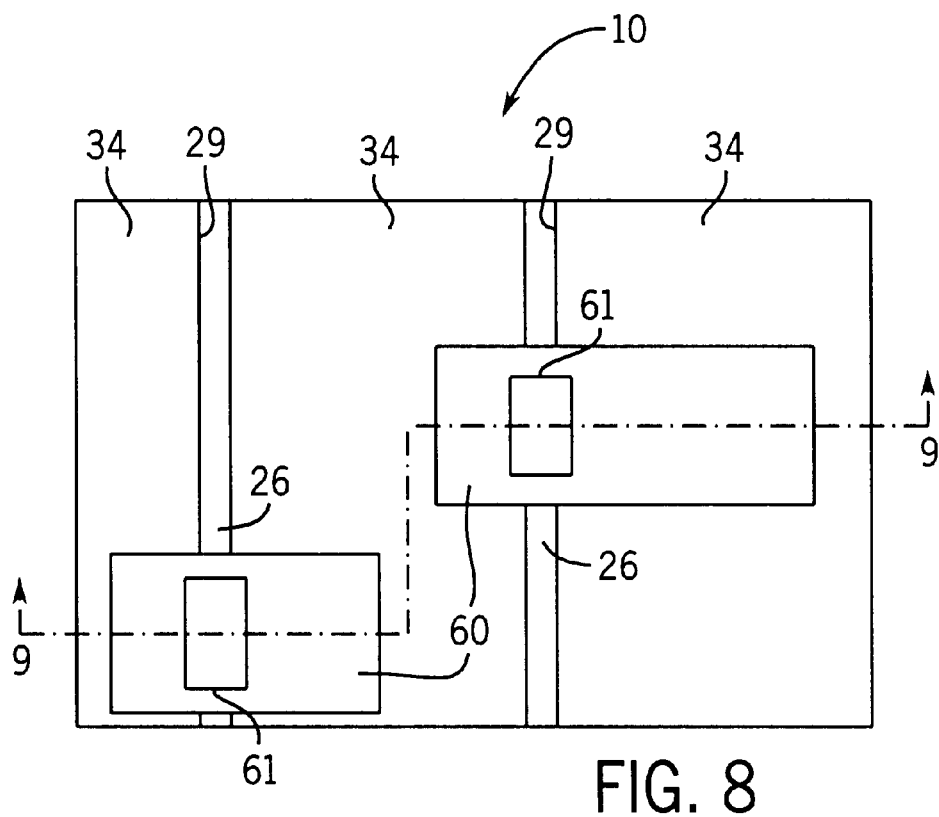
FIG. 8 is a schematic top view of the integrated circuit of FIG. 1, illustrating a via mask step, according to an exemplary embodiment.
Figure 9:
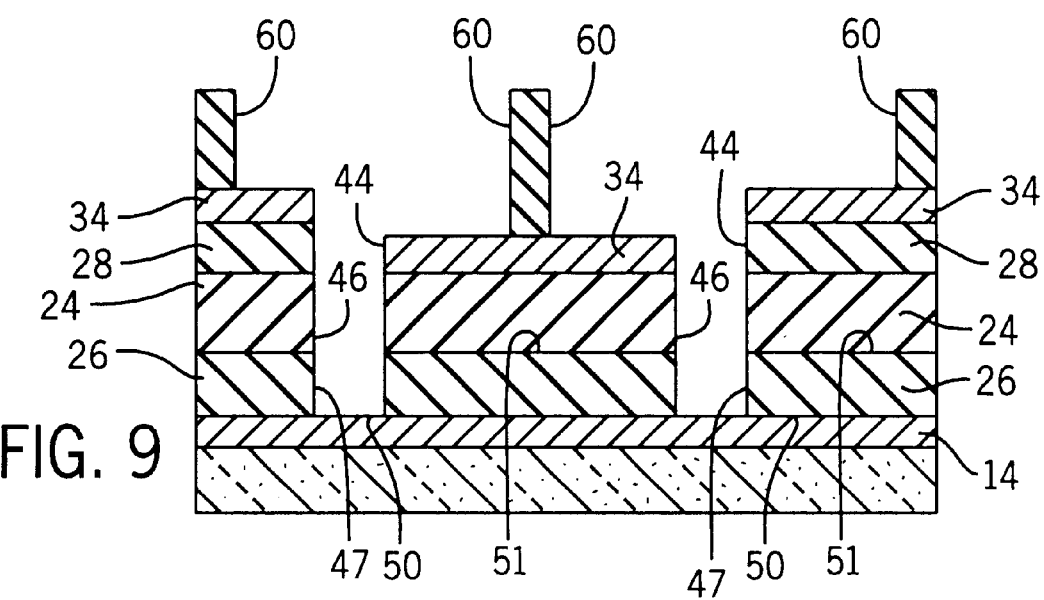
FIG. 9 is a schematic cross-sectional view of the integrated circuit of FIG. 1, illustrating an insulative layer etch step, according to an exemplary embodiment.

Referring now to FIG. 8, a via mask having apertures 60 is applied. The via mask is a non-critical mask which covers all areas of portion 10 except areas around vias. In this exemplary embodiment, the via mask is rectangular and is about twice the area of the dual damascene mask (i.e., layers 34 and 28). FIG. 9 illustrates the cross-sectional view of portion 10 having the via mask and apertures 60. Apertures 60 can be made large and the alignment of the mask is not critical because layer 24 is covered by layer 28, which serves as a hard mask. The via mask opens vias to fabricated layer 14. A small box illustrates the critical via size needed in a conventional dual damascene process, and is illustrated solely for comparison purposes.

Using the same metal hard mask comprising layers 28 and 34 and apertures 44, insulative layer 26 is etched to form trench 47. Trench 47 is preferably 30–50 nm wide and 200–500 nm deep. Trench 47 extends from upper surface 51 of insulative layer 26 to upper surface 50 of fabricated layer 14. In this exemplary embodiment, fabricated layer 14 includes a metal cap layer which acts as an etch step layer for the etching step. Preferably, the etching step is highly selective to etch layer 26, but not layers 24, 28, 34 or 14.

Figure 6:
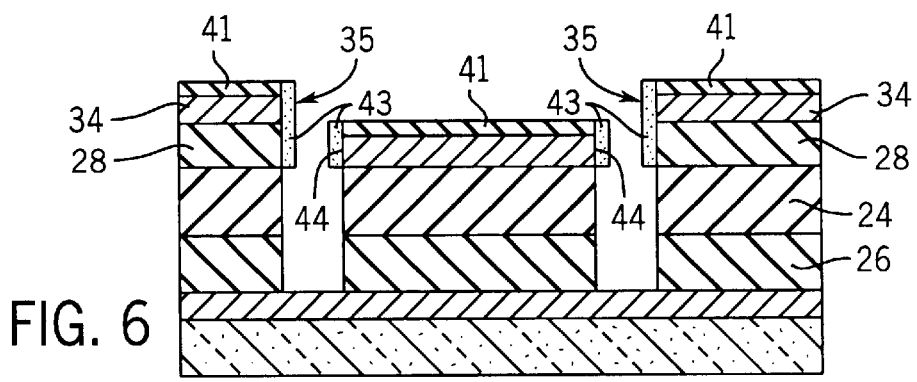
FIG. 6 is a schematic cross-sectional view of the integrated circuit of FIG. 1 illustrating a second self-assembled monolayer forming step, according to an exemplary embodiment.
Figure 7:
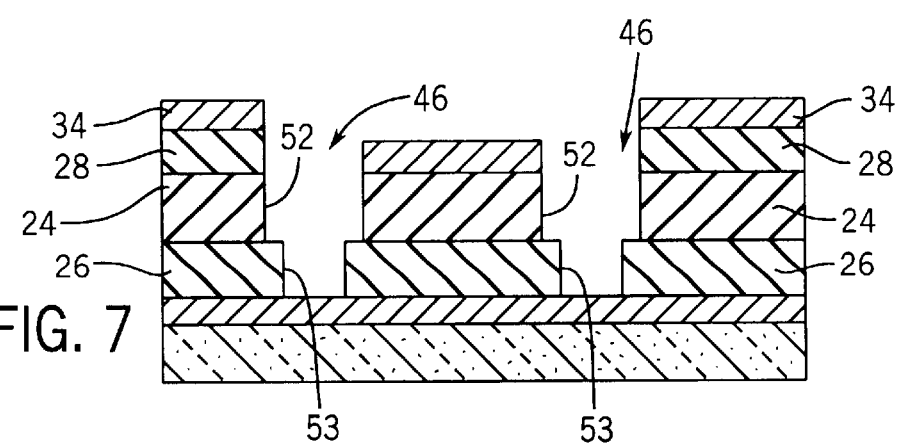
FIG. 7 is a schematic cross-sectional view of the integrated circuit of FIG. 1 illustrating a second insulative layer etch step, according to an exemplary embodiment.

Referring now to FIG. 6, metal layers 28 and 34 are exposed again to a thiol 35 to provide a second self-assembled monolayer having ordered portions 41 and disordered portions 43. An etch process of the self-assembled monolayer will widen trough 44 by etching layers 28 and 34. Referring to FIG. 7, an etch step selective to insulative layer 24 but not insulative layer 26 is provided, again using layers 34 and 28 as a hard mask. Thus, trench 46 includes an upper portion 52 having a width of approximately 50–80 nm, or less than 100 nm and a lower portion 53 having a narrower width.

Referring again to FIG. 1, metal layers 28 and 34 are removed (e.g., by etching with an etchant that does not etch layers 24 or 26), and trench 46 is filled with conductive material 20 by metal deposition and planarization. Subsequently, metal interconnect lines can be fabricated to provide conductivity between conduction material 20 and other portions of the IC.

Advantageously, using a self-assembled monolayer in a dual damascene process allows reduction of the width or widths of trench 46 beyond that capable with prior dual damascene processes.

Metal layers 28 and 34 may be the same metals or different metals in alternative embodiments. Alternatively, other materials besides metal may be used, provided the materials provide a suitable base on which to grow the self-assembled monolayer. Further, other chemical structures besides thiols may be utilized for the SAM. Various structures may be fabricated which substitute for sharp edges 36 in performing the function of providing a portion or site at which selective etching can be obtained.

While the exemplary embodiments illustrated in the FIGS. and described above are presently preferred, it should be understood that these embodiments are offered by way of example only. For example, self-assembled monolayer technology is relatively young, and additional improvements in the technology are expected. Such improvements will certainly find applications in the teachings herein. Various alkanethiolites, thiols, and other chemical structures may be suitable for forming a self-assembled monolayer, and are contemplated herein. Accordingly, the present invention is not limited to a particular embodiment, but extends to various modifications that nevertheless fall within the scope of the appended claims.

What is claimed is:

1. A method of fabricating a trench on an integrated circuit having first and second insulative layers, comprising:
    providing a layer of material over the first and second insulative layers;
    forming a first self-assembled monolayer on the layer of material;
    etching the first self-assembled monolayer to form a first aperture in the layer of material;
    etching the first and second insulative layers through the first aperture to form a first portion of the trench;
    forming a second self-assembled monolayer on the layer of material;
    etching the second self-assembled monolayer to form a second aperture in the layer of material wider than the first aperture; and
    etching the second insulative layer through the second aperture to form a second portion of the trench.

2. The method of claim 1, wherein the insulative layers have etch selectivities differing by at least 2:1.

3. The method of claim 1, wherein the layer of material is between 50 and 80 nm thick.

4. The method of claim 1, wherein the layer of material is a metal layer, further comprising patterning a second metal layer over the metal layer.

5. The method of claim 4, wherein the first self-assembled monolayer has a disordered portion at an edge between the first and second metal layers.

6. The method of claim 4, wherein the fist and second metals have the same chemical composition.

7. The method of claim 5, wherein the first self-assembled monolayer is etched selectively at the disordered portion.

8. A method of fabricating a trench on an integrated circuit, the integrated circuit disposed on a semiconductor substrate, comprising:
    (a) providing an insulative material having first and second insulative layers;
    (b) providing a layer of material over the first and second insulative material;
    (c) providing etch selectivity to a portion of the layer by exposing the layer to a thiol;
    (d) etching the portion having the etch selectivity to form a first aperture in the layer;, (e) etching the first insulative layer through the first aperture to form a first portion of the trench in the first insulating layer;

(f) repeating steps (c) through (e) to form a second aperture wider than the first aperture and to form a second portion of the trench in the second insulating layer wider than the first portion of the trench.

9. The method of claim 8, wherein the insulative material includes a first insulative layer over a second insulative layer, the first and second insulative layers having different etch selectivities by a ratio of at least 2:1.

10. The method of claim 8, wherein the layer of material is a metal.

11. The method of claim 8, wherein the layer of material is between 50 and 80 nm thick.

12. The method of claim 8, wherein step (c) includes providing a self-assembled monolayer over the layer of material.

13. The method of claim 8, further comprising patterning a second layer of material over the layer of material, wherein the etch selectivity portion lies at an edge between the two layers of material.

14. The method of claim 8, wherein the first portion of the trench is less than 50 nm wide and the second portion of the trench is less than 100 nm wide.

15. A method of fabricating a trench on an integrated circuit having first and second insulating layers, comprising:

providing a layer of material over the first and second insulative layers;

forming a first layer of molecules by self-assembling on the layer of material;

etching the first layer of molecules formed by self-assembling to form a first aperture in the layer of material;

etching the first and second insulative layers through the first aperture to form a first portion of the trench;

forming a second layer of molecules by self-assembling on the layer of material;

etching the layer of molecules formed by self-assembling to form a second aperture in the layer of material wider than the first aperture;

and etching the second insulative layer through the second aperture to form a second portion of the trench.

16. The method of claim 5, wherein the insulative layers have etch selectivities differing by at least 2:1.

17. The method of claim 5, wherein the layer of material is between 50 and 80 nm thick.

18. The method of claim 15, wherein the layer of material is a first metal layer, further comprising patterning a second metal layer over the first metal layer.

19. The method of claim 18, wherein the first and second metal layers have the same chemical composition.

20. The method of claim 18, wherein the first layer of molecules formed by self-assembling has a disordered portion at an edge between the first and second metal layers.

21. The method of claim 20, wherein the first layer of molecules formed by self-assembling is etched selectively at the disordered portion.

* * * * *

UNITED STATES PATENT AND TRADEMARK OFFICE
CERTIFICATE OF CORRECTION

PATENT NO.   : 6,534,399 B1
DATED        : March 18, 2003
INVENTOR(S)  : Zoran Krivokapic It is certified that error appears in the above-identified patent and that said Letters Patent is hereby corrected as shown below:

Column 6,
Line 61, delete "material" and insert therefor -- layers --.

Column 7,
Line 6, delete "insulating" and insert therefor -- insulative --.
Lines 8-10, delete "wherein the insulative material includes a first insulative layer over a second insulative layer,".

Column 8,
Line 8, insert -- second -- before "layer".
Lines 13 and 15, delete "5" and insert therefor -- 15 --.
Line 22, delete "18" and insert therefor -- 19 --.

Signed and Sealed this

Ninth Day of September, 2003

JAMES E. ROGAN
*Director of the United States Patent and Trademark Office*